(12) United States Patent
Tsai et al.

(10) Patent No.: US 9,549,468 B1
(45) Date of Patent: Jan. 17, 2017

(54) SEMICONDUCTOR SUBSTRATE, SEMICONDUCTOR MODULE AND METHOD FOR MANUFACTURING THE SAME

(71) Applicant: ADVANCED SEMICONDUCTOR ENGINEERING, INC., Kaohsiung (TW)

(72) Inventors: Li-Chuan Tsai, Kaohsiung (TW); Chih-Cheng Lee, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/798,384

(22) Filed: Jul. 13, 2015

(51) Int. Cl.
| | |
|---|---|
| H05K 1/11 | (2006.01) |
| H05K 1/03 | (2006.01) |
| H05K 1/16 | (2006.01) |
| H05K 7/00 | (2006.01) |
| H05K 1/18 | (2006.01) |
| H05K 1/02 | (2006.01) |
| H05K 3/36 | (2006.01) |
| H05K 3/00 | (2006.01) |
| H05K 3/22 | (2006.01) |
| H05K 3/40 | (2006.01) |

(52) U.S. Cl.
CPC ............ *H05K 1/115* (2013.01); *H05K 1/0298* (2013.01); *H05K 1/181* (2013.01); *H05K 3/0017* (2013.01); *H05K 3/22* (2013.01); *H05K 3/36* (2013.01); *H05K 3/40* (2013.01); *H05K 2201/0158* (2013.01)

(58) Field of Classification Search
CPC ...... H05K 1/115; H05K 1/0296; H05K 1/181; H05K 3/36; H05K 3/0017; H05K 3/22; H05K 3/40; H05K 2201/0158
USPC .................. 174/255, 260, 262; 361/760, 761
See application file for complete search history.

(56) References Cited

U.S. PATENT DOCUMENTS

| | | | | |
|---|---|---|---|---|
| 4,849,284 A | * | 7/1989 | Arthur ..................... | C08K 9/06 174/255 |
| 5,024,871 A | * | 6/1991 | Arthur ..................... | C04B 26/08 257/E23.007 |
| 6,107,683 A | * | 8/2000 | Castro ..................... | H01L 23/24 257/700 |
| 8,335,084 B2 | | 12/2012 | Lee et al. | |
| 8,872,041 B2 | * | 10/2014 | Lee ........................ | H05K 1/186 174/250 |

(Continued)

*Primary Examiner* — Sherman Ng
(74) *Attorney, Agent, or Firm* — Foley & Lardner LLP; Cliff Z. Liu

(57) ABSTRACT

The present disclosure relates to a semiconductor substrate, a semiconductor module and a method for manufacturing the same. The semiconductor substrate includes a first dielectric structure, a second dielectric structure, a first patterned conductive layer and a second patterned conductive layer. The first dielectric structure has a first surface and a second surface opposite the first surface. The second dielectric structure has a third surface and a fourth surface opposite the third surface, where the fourth surface is adjacent to the first surface. The second dielectric structure defines a through hole extending from the third surface to the fourth surface. A cavity is defined by the through hole and the first dielectric structure. The first patterned conductive layer is disposed on the first surface of the first dielectric structure. The second patterned conductive layer is disposed on the second surface of the first dielectric structure.

20 Claims, 17 Drawing Sheets

(56) References Cited

U.S. PATENT DOCUMENTS

| | | | | |
|---|---|---|---|---|
| 2006/0237225 | A1* | 10/2006 | Kariya | H01L 23/49827 |
| | | | | 174/260 |
| 2008/0185704 | A1 | 8/2008 | Hsu et al. | |
| 2010/0096177 | A1* | 4/2010 | Lee | H05K 1/113 |
| | | | | 174/264 |

* cited by examiner

SEMICONDUCTOR SUBSTRATE, SEMICONDUCTOR MODULE AND METHOD FOR MANUFACTURING THE SAME

BACKGROUND

1. Technical Field

The present disclosure relates to a semiconductor substrate, a semiconductor module including the same and a method for their manufacturing.

2. Description of the Related Art

The demand for consumer electronic products continues to increase, along with a demand for smaller and lighter products. Correspondingly, it is desirable to reduce a total volume occupied by a substrate and components mounted on the substrate.

SUMMARY

An aspect of the present disclosure relates to a semiconductor substrate. In one embodiment, the semiconductor substrate comprises a first dielectric structure, a second dielectric structure, a first patterned conductive layer and a second patterned conductive layer. The first dielectric structure has a first surface and a second surface opposite the first surface. The second dielectric structure has a third surface and a fourth surface opposite the third surface, where the fourth surface is adjacent to the first surface. The second dielectric structure defines a through hole extending from the third surface to the fourth surface. A cavity is defined by the through hole and the first dielectric structure. The first patterned conductive layer is disposed on the first surface of the first dielectric structure. The second patterned conductive layer is disposed on the second surface of the first dielectric structure.

Another aspect of the present disclosure relates to a semiconductor module. In one embodiment, the semiconductor module comprises a semiconductor substrate and an electrical component. The semiconductor substrate comprises a first dielectric structure, a second dielectric structure, a first patterned conductive layer and a second patterned conductive layer. The first dielectric structure has a first surface and a second surface opposite the first surface. The second dielectric structure has a third surface and a fourth surface opposite the third surface, where the fourth surface is adjacent to the first surface. The second dielectric structure defines a through hole extending from the third surface to the fourth surface. A cavity is defined by the through hole and the first dielectric structure. The first patterned conductive layer is disposed on the first surface of the first dielectric structure. The second patterned conductive layer is disposed on the second surface of the first dielectric structure. The electrical component is disposed in the cavity and is electrically connected to the second patterned conductive layer.

Another aspect of the present disclosure relates to a method for manufacturing a semiconductor substrate. In one embodiment, the method comprises: (a) providing a first sub-substrate; (b) providing a second sub-substrate, wherein the second sub-substrate has a through hole; and (c) bonding the first sub-substrate to the second sub-substrate, so that a cavity is defined by the through hole and the first sub-substrate.

In another embodiment, (a) comprises: (a1) providing a carrier and a metal layer on the carrier; (a2) forming at least one electrical contact on the metal layer; and (a3) forming a first dielectric structure on the metal layer to cover the electrical contact to form the first sub-substrate.

DETAILED DESCRIPTION

Figure 1:
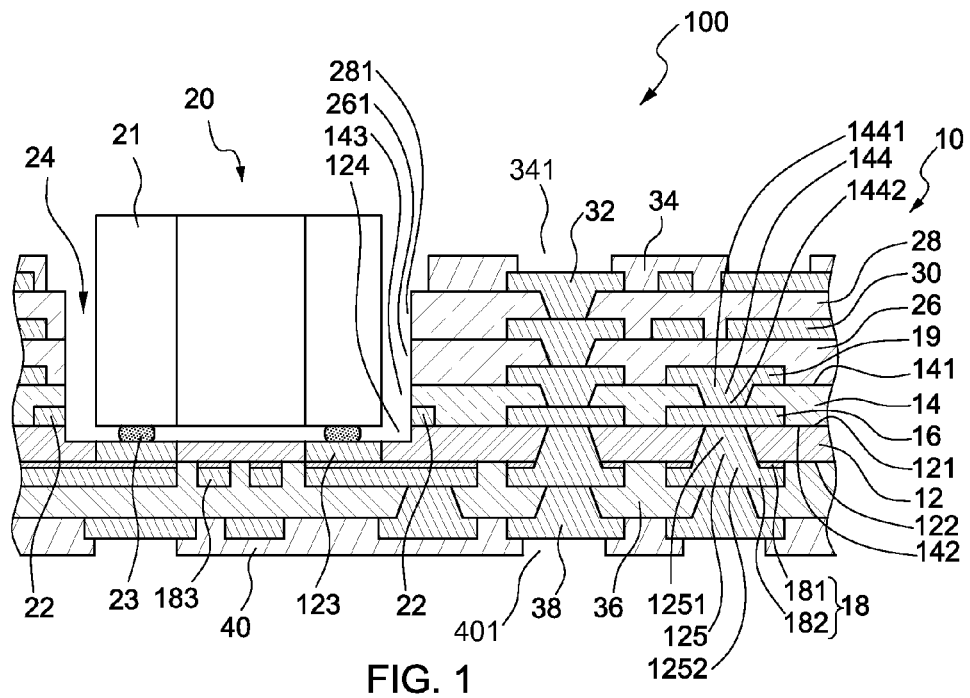
FIG. 1 illustrates a cross-sectional view of a semiconductor module according to an embodiment of the present disclosure.

FIG. 1 illustrates a cross-sectional view of a semiconductor module 100 according to an embodiment of the present disclosure. The semiconductor module 100 comprises a semiconductor substrate 10 and an electrical component 20. The semiconductor substrate comprises a first dielectric structure 12, a second dielectric structure 14, a first patterned conductive layer 16, a second patterned conductive layer 18, a third patterned conductive layer 19 and a positioning structure 22.

The first dielectric structure 12 includes one or more of an insulating material, a dielectric material, or a hydrophobic material. Examples include a polypropylene or a prepreg material with fiberglass. As used in this disclosure, a hydrophobic material, for example, may form a contact angle with water greater than 90 degrees, such as at least approximately 91 degrees, at least approximately 93 degrees, at least approximately 95 degrees, or at least approximately 97 degrees. In one or more embodiments, the first dielectric structure 12 includes an adhesive material adhered to the second dielectric structure 14 directly. In other embodiments, the first dielectric structure 12 is bonded to the second dielectric structure 14 through an adhesive layer (not shown) therebetween. As shown in the embodiment of FIG. 1, the first dielectric structure 12 is a single layer structure; however, in other embodiments, the first dielectric structure 12 may include multiple layers, such as in a multi-layer build-up structure or other multi-layer structure.

The first dielectric structure 12 has a first surface 121 and a second surface 122. The second surface 122 is opposite the first surface 121. The first dielectric structure 12 defines one or more openings 124. In the embodiment illustrated in FIG. 1, the first dielectric structure 12 defines one opening 124 which is recessed from the first surface 121 thereof. In other embodiments, more than one opening 124 is recessed from the first surface 121 of the first dielectric structure 12.

One or more electrical contacts 123 are embedded in the first dielectric structure 12 and are exposed in the opening 124. An upper surface of the electrical contact 123 is substantially coplanar with a bottom surface of the opening 124, and a bottom surface of the electrical contact 123 is substantially coplanar with the second surface 122. In one or more embodiments, a thickness of the first dielectric structure 12 is about 15 µm to about 40 µm, and a thickness of the electrical contact 123 is about 10 µm to about 30 µm. The electrical contact 123 includes a conductive material.

As used in this disclosure, the term "conductive material" encompasses both substantially uniform materials and mixtures of materials. For example, a conductive or non-conductive base material may include conductive flakes, rods, fibers, or other conductive pieces dispersed in the base material. For another example, the conductive material may be one of, or a combination of, various metals or metal alloys. For a further example, the conductive material may be, or may include, a conductive non-metal. In one or more embodiments, one conductive material is used; however, in other embodiments, different conductive materials may be used for different ones of the components. By way of example, both the first patterned conductive layer 16 and the second patterned conductive layer 18 may be of the same conductive material or different conductive materials. In one or more embodiments, copper or a copper alloy is used as a conductive material for one or more components.

The electrical contact 123 is electrically connected to the second patterned conductive layer 18. In one or more embodiments, the electrical contact 123 physically contacts the second patterned conductive layer 18.

One or more first vias 125 are disposed in the first dielectric structure 12, and connect the first patterned conductive layer 16 and the second patterned conductive layer 18. The first via 125 includes a conductive material. The first via 125 includes an electrically and physically connected upper portion 1251 and lower portion 1252. The upper portion 1251 is adjacent to, or abuts, the first patterned conductive layer 16, and the lower portion 1252 is adjacent to, or abuts, the second patterned conductive layer 18. The first via 125 gradually increases in width from the first patterned conductive layer 16 to the second patterned conductive layer 18, such that a width of the upper portion 1251 of the first via 125 is less than a width of the lower portion 1252 of the first via 125.

The second dielectric structure 14 includes one or more of an insulating material, a dielectric material, or a hydrophobic material. Examples include a polypropylene or a prepreg material with fiberglass. The second dielectric structure 14 may include one or more of the same or similar materials to the materials of the first dielectric structure 12. Alternatively, the second dielectric structure 14 may include different materials than are included in the first dielectric structure 12. In the embodiment illustrated in FIG. 1, the second dielectric structure 14 is a single layer structure. In other embodiments, the second dielectric structure 14 is multi-layered, such as a multi-layer build-up structure or other multi-layer structure. In one or more embodiments, a thickness of the second dielectric structure 14 is about 30 µm to about 80 µm.

The second dielectric structure 14 has a third surface 141 and a fourth surface 142, and defines one or more through holes 143. The fourth surface 142 is opposite the third surface 141, and the fourth surface 142 is adjacent to the first surface 121 of the first dielectric structure 12. In one or more embodiments, the first dielectric structure 12 is adhered to the second dielectric structure 14 directly; thus, the fourth surface 142 of the second dielectric structure 14 contacts the first surface 121 of the first dielectric structure 12 directly; however, in other embodiments, the first dielectric structure 12 is bonded to the second dielectric structure 14 through an adhesive layer therebetween; thus, the fourth surface 142 of the second dielectric structure 14 may not contact the first surface 121 of the first dielectric structure 12.

Each through hole 143 extends from the third surface 141 to the fourth surface 142. One or more second vias 144 are disposed in the second dielectric structure 14, and connect the first patterned conductive layer 16 and the third patterned conductive layer 19. The second via 144 includes a conductive material. The second via 144 includes an electrically and physically connected upper portion 1441 and lower portion 1442. The upper portion 1441 is adjacent to, or abuts, the third patterned conductive layer 19, and the lower portion 1442 is adjacent to, or abuts, the first patterned conductive layer 16. The second via 144 gradually increases in width from the first patterned conductive layer 16 to the third patterned conductive layer 19, such that a width of the upper portion 1441 of the second via 144 is greater than a width of the lower portion 1442 of the second via 144.

The first patterned conductive layer 16 is disposed on the first surface 121 of the first dielectric structure 12. The first patterned conductive layer 16 includes a conductive material. In the embodiment illustrated in FIG. 1, the first patterned conductive layer 16 is embedded in the second dielectric structure 14, and is exposed from the fourth surface 142. That is, the bottom surface of the first patterned conductive layer 16 is substantially coplanar with the fourth surface 142 of the second dielectric structure 14.

The second patterned conductive layer 18 is disposed on the second surface 122 of the first dielectric structure 12. The second patterned conductive layer 18 includes a conductive material. In the embodiment illustrated in FIG. 1, the second patterned conductive layer 18 includes a first metal layer 181 and a second metal layer 182. In other embodiments, the second patterned conductive layer 18 includes different or additional layers. The first metal layer 181 is located on the second surface 122 of the first dielectric structure 12, and the second metal layer 182 is located on the first metal layer 181. The first metal layer 181 is formed, for example, by etching a conductive foil. The second metal layer 182 is formed, for example, by an electroplating process. In one or more embodiments, the second metal layer 182 and the first vias 125 are formed integrally, such that there is no physical boundary between the second metal layer 182 and each first via 125.

The second patterned conductive layer 18 further includes one or more conductive traces 183 disposed on the second surface 122 of the first dielectric structure 12. The conductive trace 183 is positioned between the electrical contacts 123, and the conductive trace 183 is not aligned with the electrical contacts 123. Therefore, the conductive trace 183 is covered by a portion of the first dielectric structure 12, and a solder 23 on the electrical contact 123 will not flow to an adjacent conductive trace 183, thereby avoiding a risk of short circuits between the electrical contact 123 and the conductive trace 183.

The third patterned conductive layer 19 is disposed on the third surface 141 of the second dielectric structure 14. The third patterned conductive layer 19 includes a conductive material. In one or more embodiments, the third patterned conductive layer 19 and the second vias 144 are formed integrally, such that there is no physical boundary between the third patterned conductive layer 19 and each second via 144.

The positioning structure 22 is disposed around the through hole 143. In the embodiment illustrated in FIG. 1, the positioning structure 22 is embedded in the second dielectric structure 14 and is exposed in the through hole 143. The positioning structure 22 includes a conductive material. The positioning structure 22 and the first patterned conductive layer 16 are portions of a same layer. The positioning structure 22 may be a ring structure or may include multiple segments. The positioning structure 22 is used for positioning of a machining tool (e.g., a drill head or a laser beam) during the formation of the through hole 143.

In the embodiment illustrated in FIG. 1, the semiconductor substrate 10 includes a third dielectric structure 26, a fourth dielectric structure 28, a fourth patterned conductive layer 30, an uppermost patterned conductive layer 32, an upper solder mask 34, a fifth dielectric structure 36, a lowermost patterned conductive layer 38 and a lower solder mask 40. The fourth patterned conductive layer 30, the uppermost patterned conductive layer 32, and the lowermost patterned conductive layer 38 each includes a conductive material.

The third dielectric structure 26 is disposed on the third surface 141 of the second dielectric structure 14. The fourth patterned conductive layer 30 is disposed on the third dielectric structure 26, and is electrically connected to the third patterned conductive layer 19. The fourth dielectric structure 28 is disposed on the third dielectric structure 26. The third dielectric structure 26 and the fourth dielectric structure 28 are built-up layers. In one or more embodiments, a total thickness of the combined dielectric structures 14, 26, 28 is about 90 μm to about 240 μm.

The third dielectric structure 26 defines a through hole 261, and the fourth dielectric structure 28 defines a through hole 281. The through holes 261, 281 correspond to the through hole 143 of the second dielectric structure 14 and also the opening 124 of the first dielectric structure 12, such that the through holes 143, 261 and 281 together with the opening 124 define a cavity 24.

The uppermost patterned conductive layer 32 is disposed on the fourth dielectric structure 28, and is electrically connected to the fourth patterned conductive layer 30. The upper solder mask 34 is disposed on the fourth dielectric structure 28, and defines one or more openings 341 to expose a portion of the uppermost patterned conductive layer 32.

The fifth dielectric structure 36 is disposed on the second surface 122 of the first dielectric structure 12. The lowermost patterned conductive layer 38 is disposed on a bottom surface of the fifth dielectric structure 36, and is electrically connected to the second patterned conductive layer 18. The lower solder mask 40 is disposed on the bottom surface of the fifth dielectric structure 36, and defines one or more openings 401 to expose a portion of the lowermost patterned conductive layer 38.

The electrical component 20 is disposed in the cavity 24 and is electrically connected to the second patterned conductive layer 18 through the electrical contacts 123. In the embodiment illustrated in FIG. 1, the electrical component 20 is a passive component that has at least two electrodes 21, and the electrodes 21 of the electrical component 20 are connected to respective ones of the electrical contacts 123 by surface mount technology (SMT). Further in the embodiment illustrated in FIG. 1, the solders 23 are disposed between the electrodes 21 and the electrical contacts 123. When mounted in the cavity 24, a top surface of the electrical component 20 is higher than the upper solder mask 34, although it may be substantially coplanar with, or recessed below, the upper solder mask 34.

Thus, as illustrated in FIG. 1, the electrical component 20 disposed in the cavity 24 of the semiconductor substrate 10 reduces an overall thickness of the semiconductor module 100.

Figure 2:
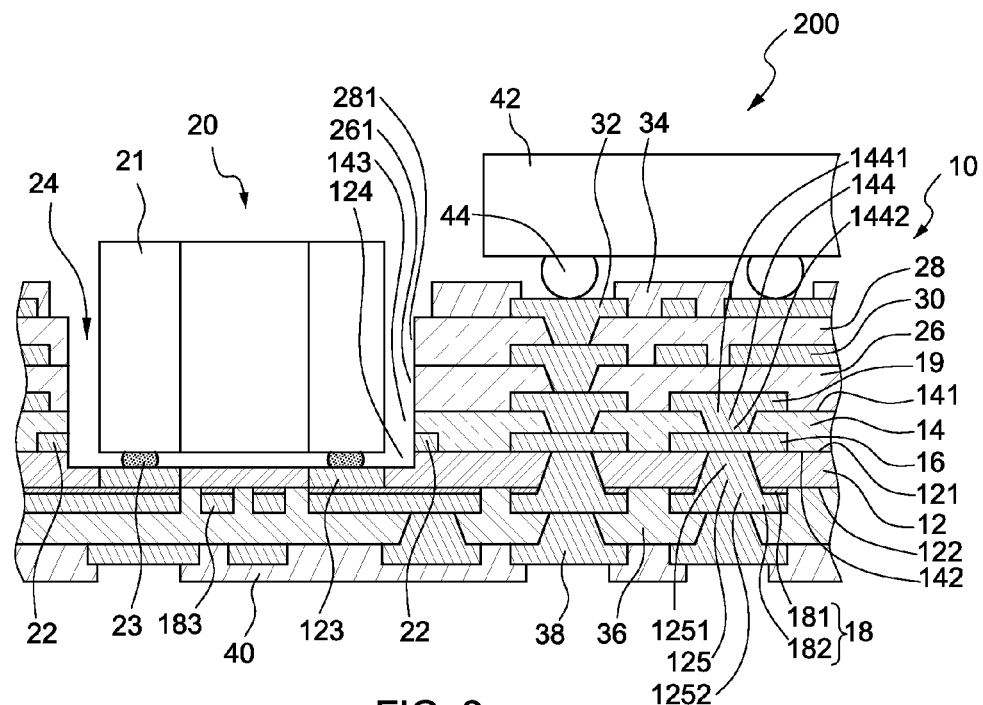
FIG. 2 illustrates a cross-sectional view of a semiconductor module according to an embodiment of the present disclosure.

FIG. 2 illustrates a cross-sectional view of a semiconductor module 200 according to an embodiment of the present disclosure. The semiconductor module 200 includes a semiconductor substrate 10, an electrical component 20 and a semiconductor device 42. The semiconductor substrate 10 and the electrical component 20 of this embodiment are as illustrated and described with respect to FIG. 1. The electrical component 20 is disposed in the cavity 24 of the semiconductor substrate 10. The semiconductor device 42 may be a semiconductor die or a semiconductor package, and is electrically connected to the semiconductor substrate 10 through the connecting elements 44. The connecting elements 44 may be, for example, solder balls or solder bumps, and are disposed on the exposed portion of the uppermost patterned conductive layer 32.

Figure 3:
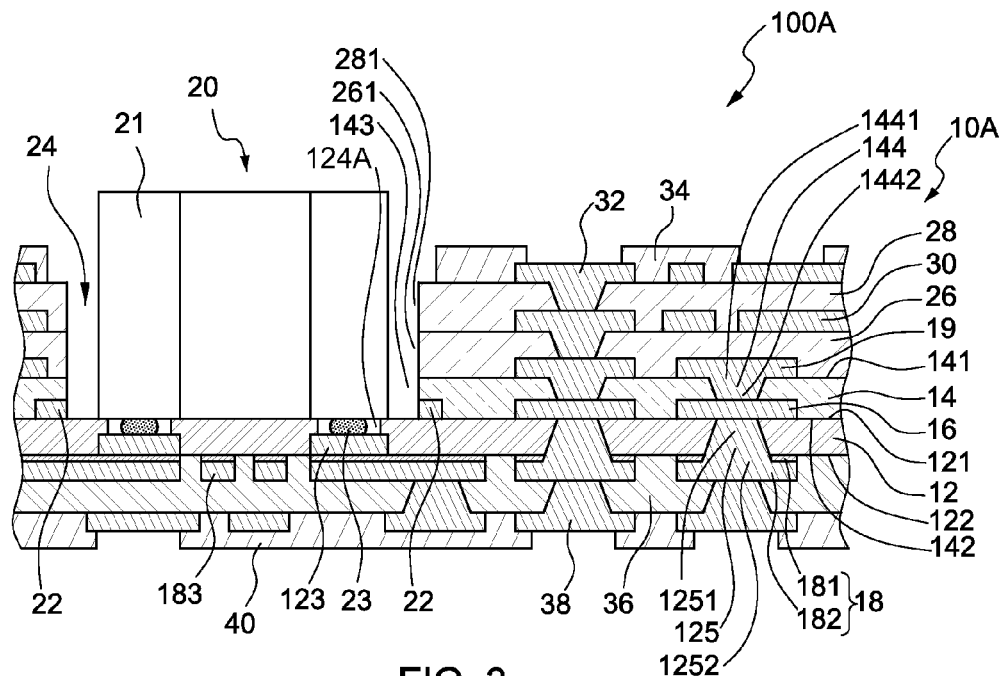
FIG. 3 illustrates a cross-sectional view of a semiconductor module according to an embodiment of the present disclosure.

FIG. 3 illustrates a cross-sectional view of a semiconductor module 100A including a semiconductor substrate 10A according to an embodiment of the present disclosure. The semiconductor module 100A of this embodiment is similar to the semiconductor module 100 illustrated in FIG. 1, except that, instead of the opening 124 corresponding in size to the cavity 24 as in FIG. 1, the first dielectric structure 12 of the semiconductor substrate 10A defines multiple openings 124A from which the electrical contacts 123 are individually exposed. That is, a width (horizontally in the orientation of FIG. 2) of each opening 124A is less than a width of the opening 124 illustrated in FIG. 1. In addition, in the semiconductor module 100A, the solders 23 are disposed in the openings 124A for connecting the electrodes 21 and the electrical contacts 123. In the semiconductor substrate 10A, the solders 23 are separated by a portion of the first dielectric structure 12, thus reducing a risk of a bridge forming between the solders 23.

Figure 4:
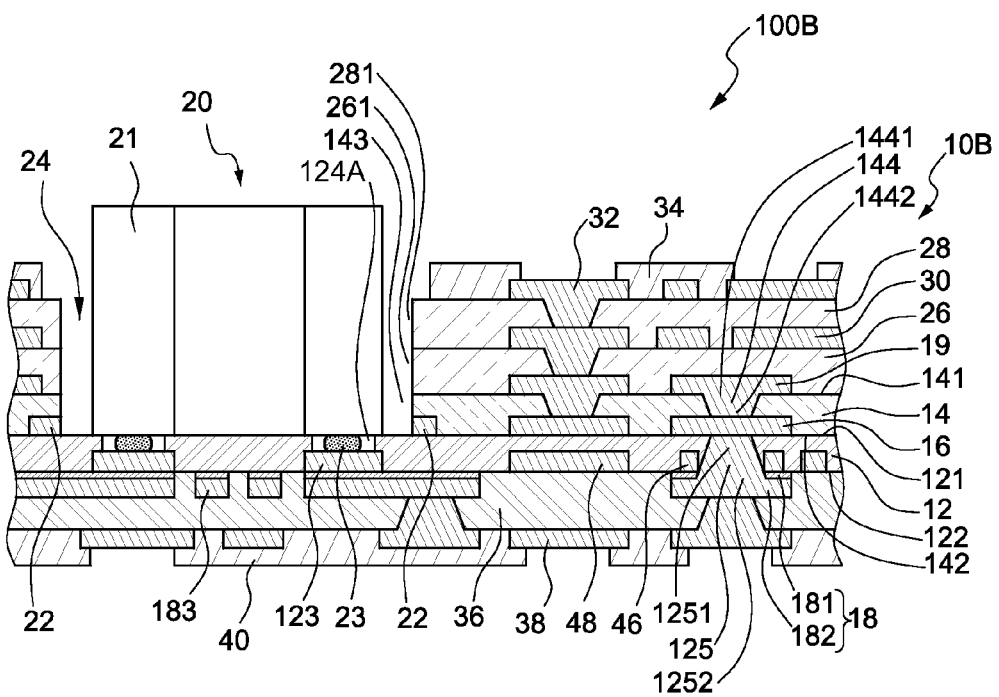
FIG. 4 illustrates a cross-sectional view of a semiconductor module according to an embodiment of the present disclosure.

FIG. 4 illustrates a cross-sectional view of a semiconductor module 100B including a semiconductor substrate 10B according to an embodiment of the present disclosure. The semiconductor module 100B of this embodiment is similar to the semiconductor module 100A illustrated in FIG. 3, except that the semiconductor substrate 10B includes one or more pads 48, and one or more second positioning structures 46 embedded in the first dielectric structure 12 and exposed from the second surface 122. The pad 48 and the positioning structure 46 each includes a conductive material. The pad 48, the second positioning structure 46 and the electrical contacts 123 are portions of a same layer. In one or more embodiments, the pad 48, the second positioning structure 46 and the electrical contact 123 and are formed by plating. The addition of the pad 48 and the second positioning structure 46 can increase a plating area, which can improve an evenness of plating. In one or more embodiments, the pad 48 is a dummy pad with no electrical function. The second positioning structure 46 is disposed around the first via 125. The second positioning structure 46 may be a ring structure or may include multiple segments. The second positioning structure 46 is used for positioning of a machining tool (e.g., a drill head or a laser beam) during subsequent formation of a through hole in which the first via 125 is to be disposed.

Figure 5:
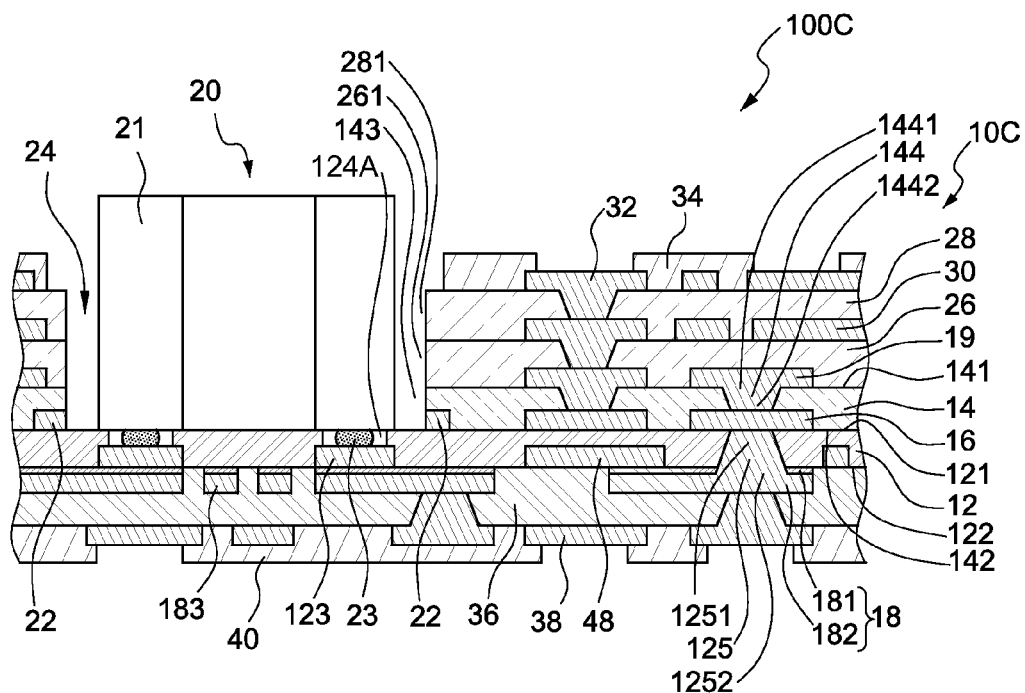
FIG. 5 illustrates a cross-sectional view of a semiconductor module according to an embodiment of the present disclosure.

FIG. 5 illustrates a cross-sectional view of a semiconductor module 100C including a semiconductor substrate 10C according to another embodiment of the present disclosure. The semiconductor module 100C of this embodiment is similar to the semiconductor module 100B illustrated in FIG. 4, except that the pad 48 of the semiconductor substrate 10C is a functional pad. The pad 48 is exposed from the second surface 122, and the second patterned conductive layer 18 contacts the pad 48.

Figure 6A:
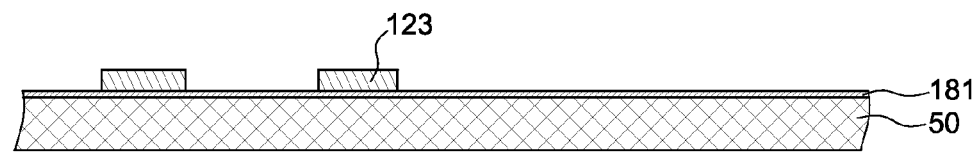
FIG. 6A, FIG. 6B, FIG. 6C, FIG. 6D, FIG. 6E, FIG. 6F, FIG. 6G, FIG. 6H, FIG. 6I, and FIG. 6J illustrate a method for manufacturing a semiconductor module according to an embodiment of the present disclosure.

FIGS. 6A-6J illustrate a method for manufacturing a semiconductor module according to an embodiment of the present disclosure. Referring to FIG. 6A, a carrier 50 and a first metal layer 181 are provided. The first metal layer 181 is, for example, a copper foil with a thickness of approximately 3 μm, and is disposed on the carrier 50. One or more electrical contacts 123 are formed on the first metal layer 181. The electrical contact 123 includes a conductive material.

Figure 6B:
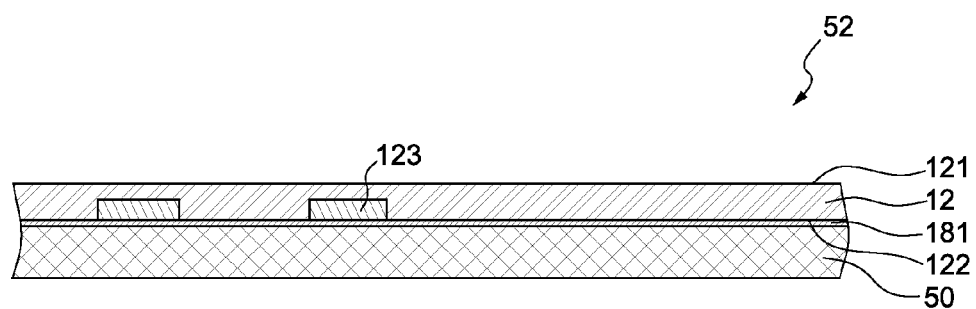

Referring to FIG. 6B, a first dielectric structure 12 is formed on the first metal layer 181 to cover the electrical contact 123 to form a first sub-substrate 52. The first sub-substrate 52 includes the carrier 50, the first metal layer 181 and the first dielectric structure 12. The first dielectric structure 12 includes one or more of an insulating material, a dielectric material, or a hydrophobic material. In one or more embodiments, the first dielectric structure 12 includes an adhesive material. In other embodiments, the first dielectric structure 12 does not include an adhesive material. In the embodiment illustrated in FIG. 6B, the first dielectric structure 12 is a single layer structure; however, in other embodiments, the first dielectric structure 12 may be multi-layer, such as a multi-layer build-up structure or other multi-layer structure. The first dielectric structure 12 has a first surface 121 and a second surface 122 opposite the first surface 121.

Figure 6C:
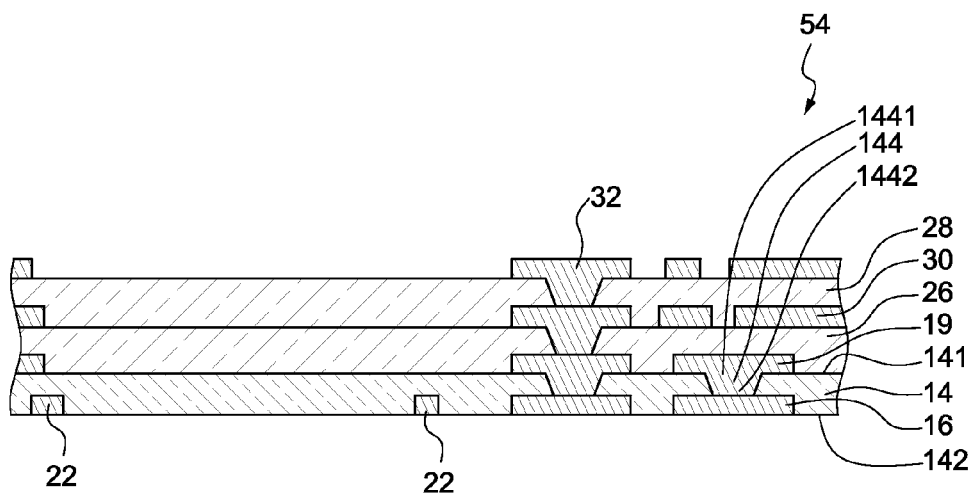

Referring to FIG. 6C, a second sub-substrate 54 is provided. In this embodiment, the second sub-substrate 54 includes a second dielectric structure 14, a positioning structure 22, a first patterned conductive layer 16, a third patterned conductive layer 19, a third dielectric structure 26, a fourth dielectric structure 28, a fourth patterned conductive layer 30 and an uppermost patterned conductive layer 32. The patterned conductive layers 16, 19, 30 and 32 each includes a conductive material. The dielectric structures 14, 26, 28 each includes one or more of an insulating material, a dielectric material, or a hydrophobic material. Examples include a polypropylene or a prepreg material with fiberglass. The material of the dielectric structures 14, 26, 28 may be same as, similar to, or different from materials used for the first dielectric structure 12. In the embodiment illustrated in FIG. 6C, the dielectric structures 14, 26, 28 are each single layer structures; however, in other embodiments, one or more of the dielectric structures 14, 26, 28 may be multi-layer structures.

The second dielectric structure 14 has a third surface 141 and a fourth surface 142 opposite the third surface 141, and includes one or more second vias 144. The first patterned conductive layer 16 and the positioning structure 22 are embedded in the second dielectric structure 14, and are exposed from the fourth surface 142. That is, bottom surfaces of the first patterned conductive layer 16 and the positioning structure 22 are substantially coplanar with the fourth surface 142 of the second dielectric structure 14. The positioning structure 22 and the first patterned conductive layer 16 are portions of a same layer and are formed at the same time. The first patterned conductive layer 16 and the positioning structure 22 each includes a conductive material. The positioning structure 22 may be a ring structure or may include a plurality of segments. The positioning structure 22 is used for positioning of a machining tool (e.g., a drill head or a laser beam) during subsequent formation of a through hole.

The third patterned conductive layer 19 is disposed on the third surface 141 of the second dielectric structure 14. The second via 144 is disposed in the second dielectric structure 14, and connects the first patterned conductive layer 16 and the third patterned conductive layer 19. The second via 144 includes a conductive material. The second via 144 includes an upper portion 1441 and a lower portion 1442. The second via 144 gradually increases in width from the first patterned conductive layer 16 to the third patterned conductive layer 19, such that a width of the upper portion 1441 of the second via 144 is greater than a width of the lower portion 1442 of the second via 144.

The third dielectric structure 26 is disposed on the third surface 141 of the second dielectric structure 14. The fourth patterned conductive layer 30 is disposed on the third dielectric structure 26, and is electrically connected to the third patterned conductive layer 19. The fourth dielectric structure 28 is disposed on the third dielectric structure 26. The uppermost patterned conductive layer 32 is disposed on the fourth dielectric structure 28, and is electrically connected to the fourth patterned conductive layer 30.

Figure 6D:
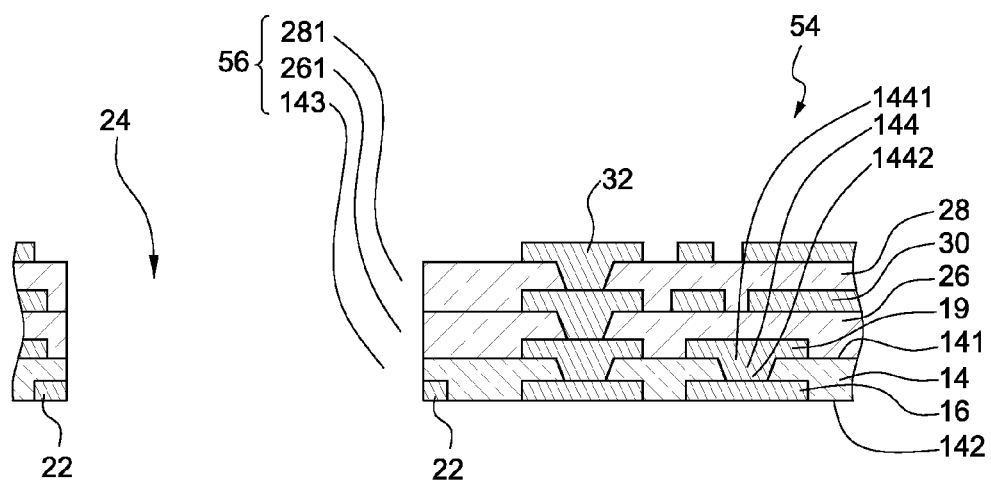

Referring to FIG. 6D, a portion of the second sub-substrate 54 is removed by, for example, a drill head or a laser beam, so as to form a through hole 56 extending through the second sub-substrate 54. In this embodiment, the through hole 56 is formed from the fourth surface 142 of the second dielectric structure 14 according to the positioning structure 22. That is, since the positioning structure 22 is exposed from the fourth surface 142, a machining tool (e.g., a drill head or a laser beam) is positioned within or towards the area enclosed by the positioning structure 22 to form the through hole 56. The positioning structure 22 is exposed in the through hole 56. It is noted that the through hole 56 includes the through holes 143, 261, 281 in the respective dielectric structures 14, 26, 28. In one or more embodiments, the second sub-substrate 54 includes the second dielectric structure 14 and omits the third and fourth dielectric structures 26, 28, such that the through hole 56 is the through hole 143.

Figure 6E:
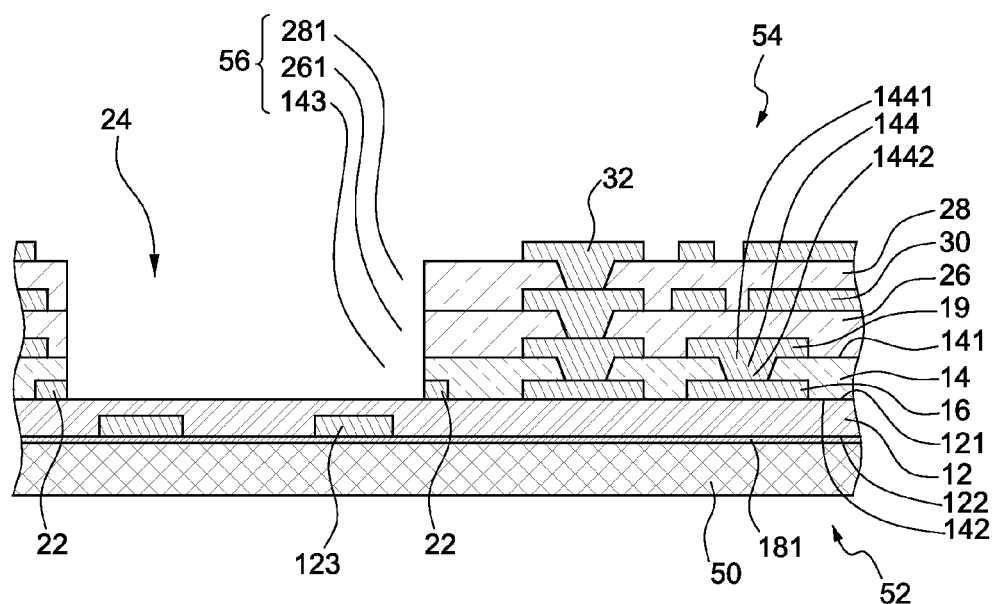

Referring to FIG. 6E, the first sub-substrate 52 is bonded to the second sub-substrate 54, so that a cavity 24 is defined by the through hole 56 and the first sub-substrate 52. The cavity 24 is positioned to expose the electrical contacts 123. In the embodiment illustrated in FIG. 6E, the first dielectric structure 12 is, or includes, an adhesive material, and is adhered to the second dielectric structure 14 directly; thus, the fourth surface 142 of the second dielectric structure 14 contacts the first surface 121 of the first dielectric structure 12 directly. That is, the first sub-substrate 52 adheres to the second sub-substrate 54 directly. However, in other embodiments, the first dielectric structure 12 does not include an adhesive material, and is bonded to the second dielectric structure 14 through an adhesive layer (not shown) therebetween; thus, the fourth surface 142 of the second dielectric structure 14 may not directly contact the first surface 121 of the first dielectric structure 12. That is, the first sub-substrate 52 is adhered to the second sub-substrate 54 by an adhesive layer.

Figure 6F:
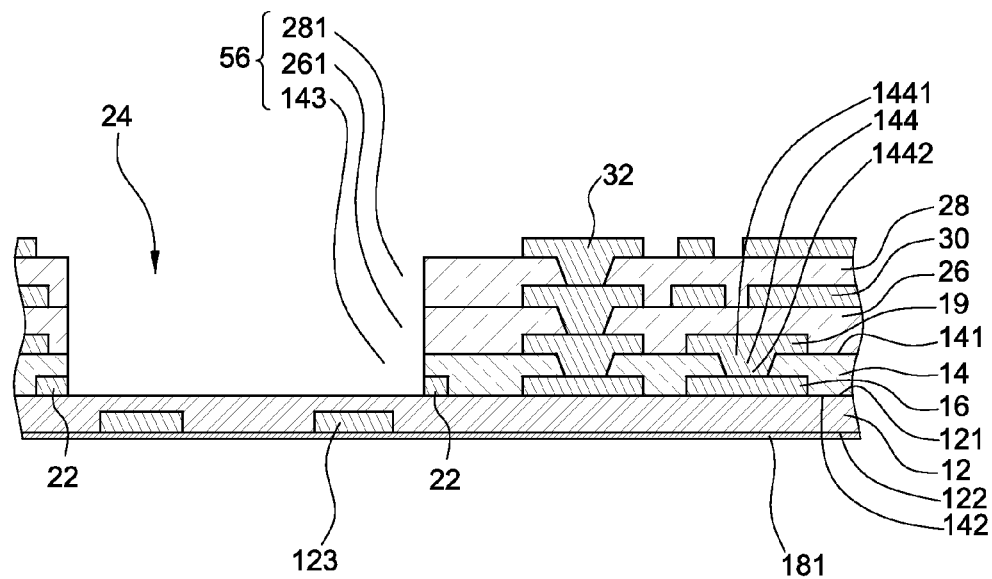

Referring to FIG. 6F, the carrier 50 is removed.

Figure 6G:
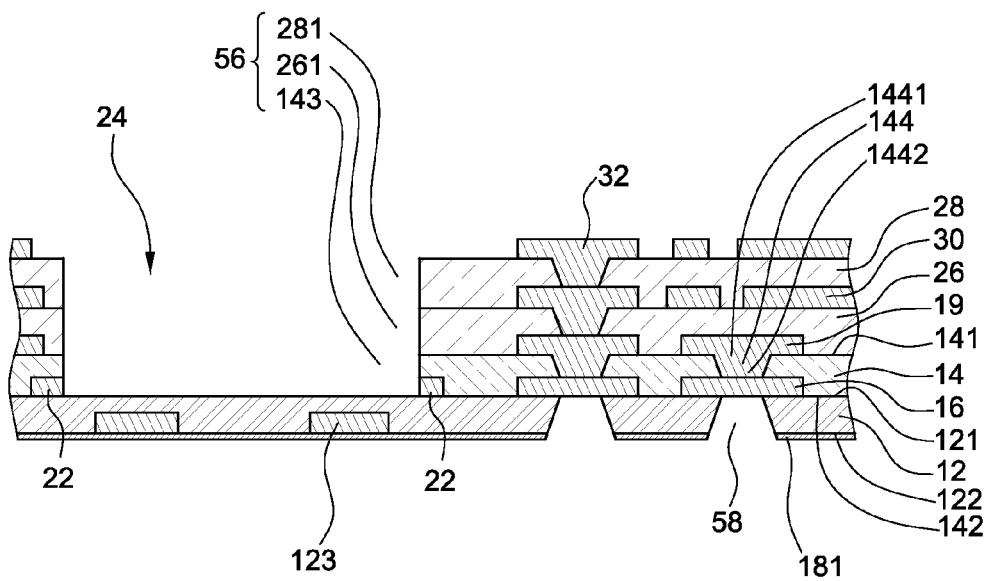

Referring to FIG. 6G, a plurality of openings 58 are formed in the first dielectric structure 12 and the first metal layer 181 to expose a portion of the first patterned conductive layer 16.

Figure 6H:
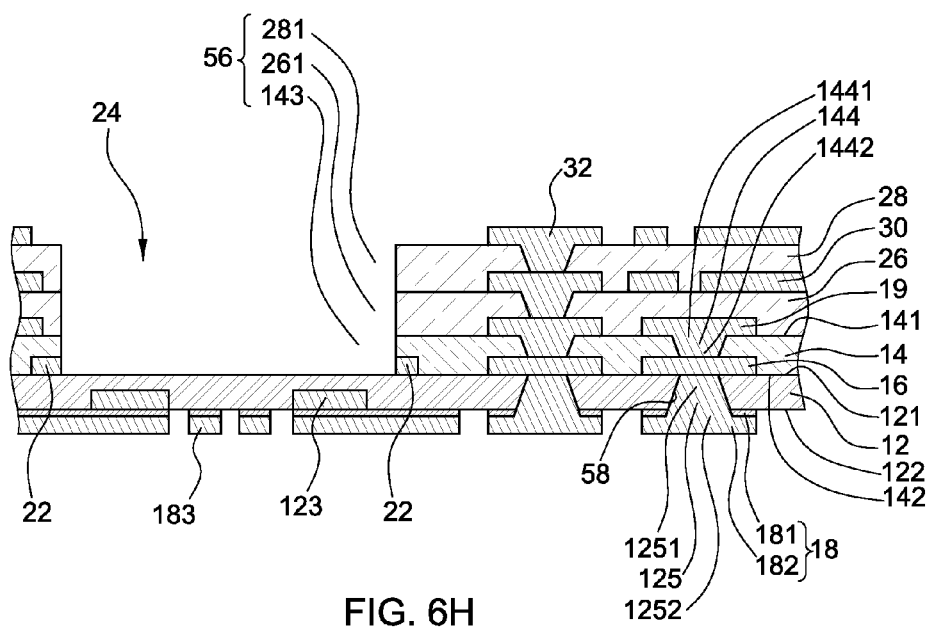

Referring to FIG. 6H, a second metal layer 182 is formed on the first metal layer 181 and in the openings 58 by, for example, electroplating. The second metal layer 182 in the openings 58 forms one or more first vias 125. The first via 125 includes an upper portion 1251 and a lower portion 1252. The first via 125 gradually increases in width from the first patterned conductive layer 16 to the second patterned conductive layer 18, such that a width of the upper portion 1251 of the first via 125 is less than a width of the lower portion 1252 of the first via 125. The second metal layer 182 on the first metal layer 181 has a predetermined pattern, so that a portion of the first metal layer 181 is covered by the second metal layer 182, and another portion of the first metal layer 181 is not covered by the second metal layer 182. The portion of the first metal layer 181 that is not covered by the second metal layer 182 is etched away to expose the second surface 122 of the first dielectric structure 12. Together, the first metal layer 181 and the second metal layer 182 form a second patterned conductive layer 18 following the etching of the first metal layer 181. In one or more embodiments, the second metal layer 182 and the first via 125 are formed integrally, such that there is no physical boundary between the second metal layer 182 and the first via 125.

The second patterned conductive layer 18 further includes one or more conductive traces 183 disposed between the electrical contacts 123. The conductive trace 183 and the electrical contacts 123 are not aligned, and there is a portion of the first dielectric structure 12 on the conductive trace 183, physically and electrically separating the conductive trace 183 from the electrical contacts 123. The electrical contacts 123 are electrically connected to the second patterned conductive layer 18. In this embodiment, the electrical contacts 123 physically contact the second patterned conductive layer 18.

Figure 6I:
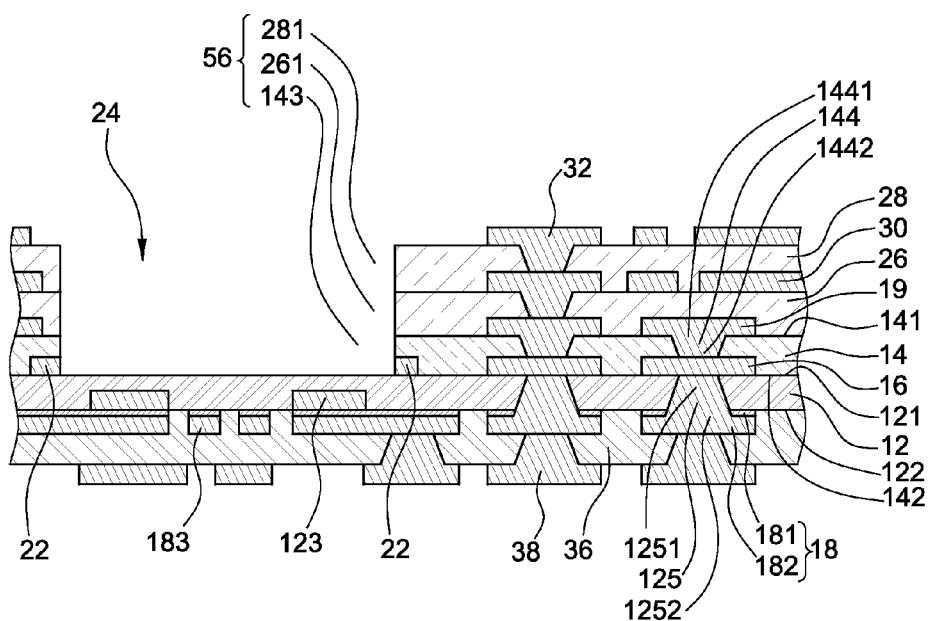

Referring to FIG. 6I, a fifth dielectric structure 36 is formed on the second surface 122 of the first dielectric structure 12 to cover the second patterned conductive layer 18. A lowermost patterned conductive layer 38 is formed on a bottom surface of the fifth dielectric structure 36. The lowermost patterned conductive layer 38 includes a conductive material, and is electrically connected to the second patterned conductive layer 18, such as through vias and traces.

Figure 6J:
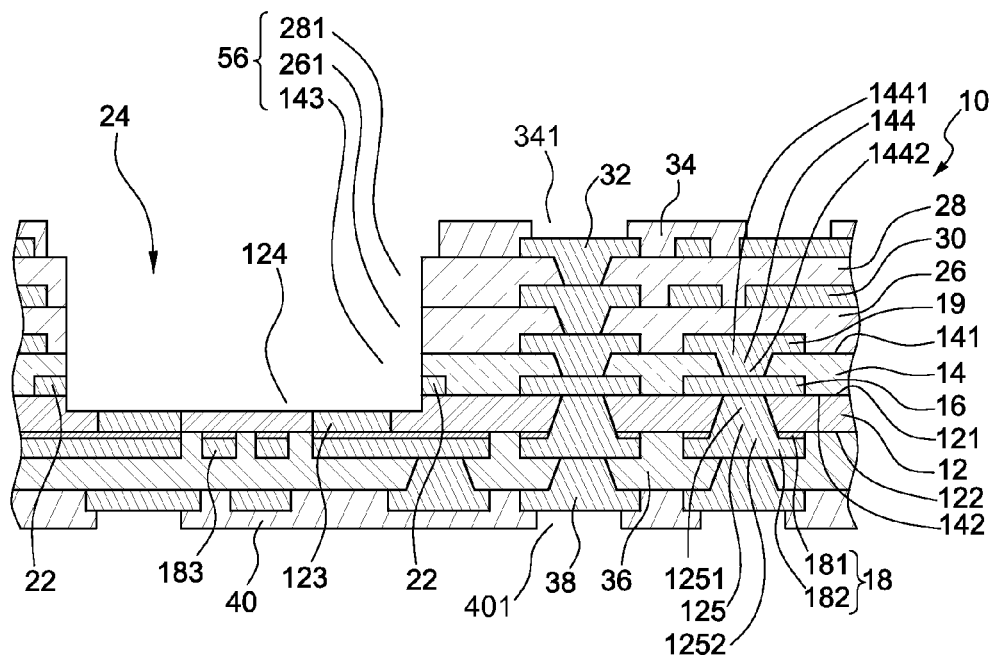

Referring to FIG. 6J, a portion of the first dielectric structure 12 is removed through the through hole 56 by, for example, a laser beam or a plasma beam, to form one or more openings 124 to expose the electrical contacts 123. An upper surface of each of the electrical contacts 123 is substantially coplanar with a bottom surface of the opening 124. In this embodiment, a size of the through hole 56 from a top view is substantially equal to that of the opening 124 (a periphery of the through hole 56 is approximately the same as a periphery of the opening 124), and a cavity 24 includes the through hole 56 and the opening 124.

An upper solder mask 34 is formed on the fourth dielectric structure 28, and defines one or more openings 341 to expose a portion of the uppermost patterned conductive layer 32. A lower solder mask 40 is formed on the bottom surface of the fifth dielectric structure 36, and defines one or more openings 401 to expose a portion of the lowermost patterned conductive layer 38. In this manner, the semiconductor substrate 10 of FIG. 1 is obtained. An electrical component 20 is disposed in the cavity 24 of the semiconductor substrate 10, and is electrically connected to the electrical contacts 123 by SMT. In this manner, the semiconductor module 100 of FIG. 1 is obtained. It is noted that there may be solder disposed between the electrical component 20 and the electrical contacts 123.

Figure 7:
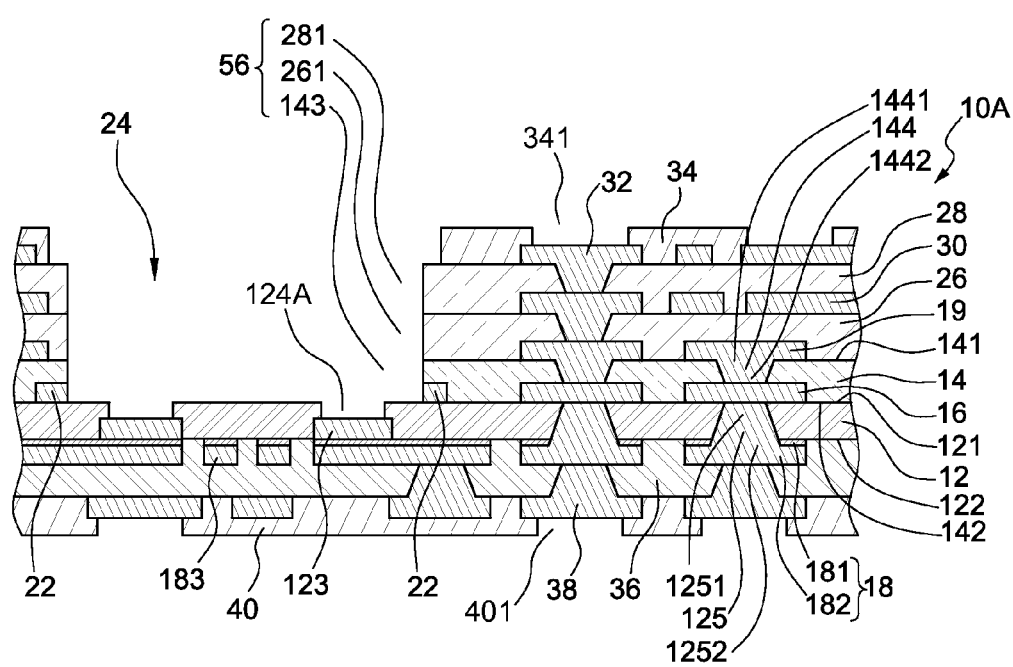
FIG. 7 illustrates a method for manufacturing a semiconductor module according to an embodiment of the present disclosure.

FIG. 7 illustrates a method for manufacturing a semiconductor module according to another embodiment of the present disclosure. A semiconductor module is formed according to the embodiment illustrated and described with respect to FIGS. 6A-6I, and, subsequent to FIG. 6I, openings 124A are formed in the first surface 121 of the first dielectric structure 12, within a periphery of the cavity 24. Each of the openings 124A corresponds to a respective one of the electrical contacts 123, so that the electrical contacts 123 are exposed by the openings 124A. As can be seen by a comparison of FIG. 6J and FIG. 7, a size of the opening 124A (FIG. 7) is smaller than that of the opening 124 (FIG. 6J). An upper solder mask 34 is formed on the fourth dielectric structure 28, and defines one or more openings 341 to expose a portion of the uppermost patterned conductive layer 32. A lower solder mask 40 is formed on the bottom surface of the fifth dielectric structure 36, and defines one or more openings 401 to expose a portion of the lowermost patterned conductive layer 38. In this manner, the semiconductor substrate 10A of FIG. 3 is obtained. An electrical component 20 is disposed in the cavity 24 of the semiconductor substrate 10A, and is electrically connected to the electrical contacts 123 by SMT. In this manner, the semiconductor module 100A of FIG. 3 is obtained. It is noted that there may be a plurality of solders disposed in the respective openings 124A for connecting the electrical component 20 and the electrical contacts 123. In the embodiment of FIG. 7, such solders would be separated by a portion of the first dielectric structure 12, thus reducing a risk of a bridge between the solders.

Figure 8A:
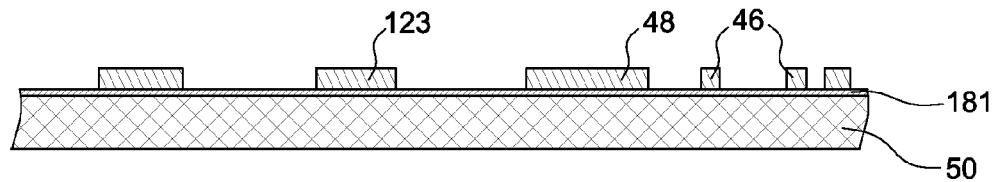
FIG. 8A, FIG. 8B, FIG. 8C, FIG. 8D, FIG. 8E, FIG. 8F, FIG. 8G, FIG. 8H, and FIG. 8I illustrate a method for manufacturing a semiconductor module according to an embodiment of the present disclosure.

FIGS. 8A-8I illustrate a method for manufacturing a semiconductor module according to another embodiment of the present disclosure. Referring to FIG. 8A, a carrier 50 and a first metal layer 181 are provided. The first metal layer 181 is, for example, a copper foil with a thickness of approximately 3 μm, disposed on the carrier 50. One or more electrical contacts 123, one or more pads 48 and one or more second positioning structures 46 are formed on the first metal layer 181. In one or more embodiments, the electrical contact 123, the pad 48 and the second positioning structure 46 are portions of a same layer and are formed by plating in the same process. For example, the electrical contact 123, the pad 48 and the second positioning structure 46 are formed by copper plating. The addition of the pad 48 and the second positioning structure 46 can increase a plating area, which can improve evenness of plating. In the embodiment illustrated in FIG. 8A, the pad 48 is a dummy pad that has no electrical function, and the second positioning structure 46 is used for positioning of a machining tool (e.g., a drill head or a laser beam) during subsequent formation of a through hole.

Figure 8B:
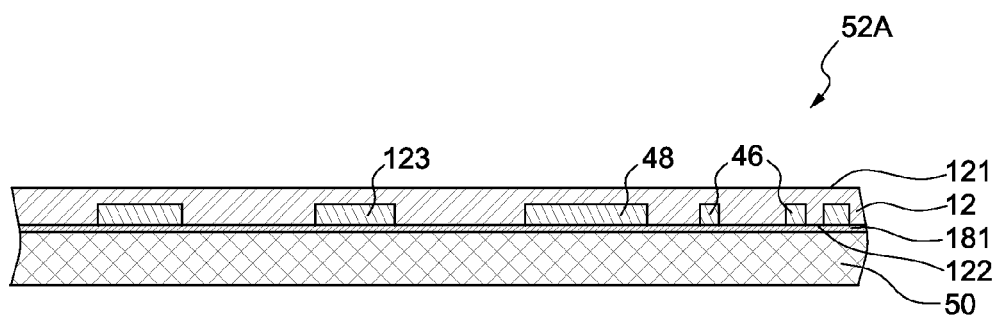

Referring to FIG. 8B, a first dielectric structure 12 is formed on the first metal layer 181 to cover the electrical contact 123, the pad 48 and the second positioning structure 46, to form a first sub-substrate 52A. The first sub-substrate 52A includes the carrier 50, the first metal layer 181, the first dielectric structure 12, the pad 48 and the second positioning structure 46. The first dielectric structure 12 of this embodiment is the same as the first dielectric structure 12 of FIG. 6B.

Figure 8C:
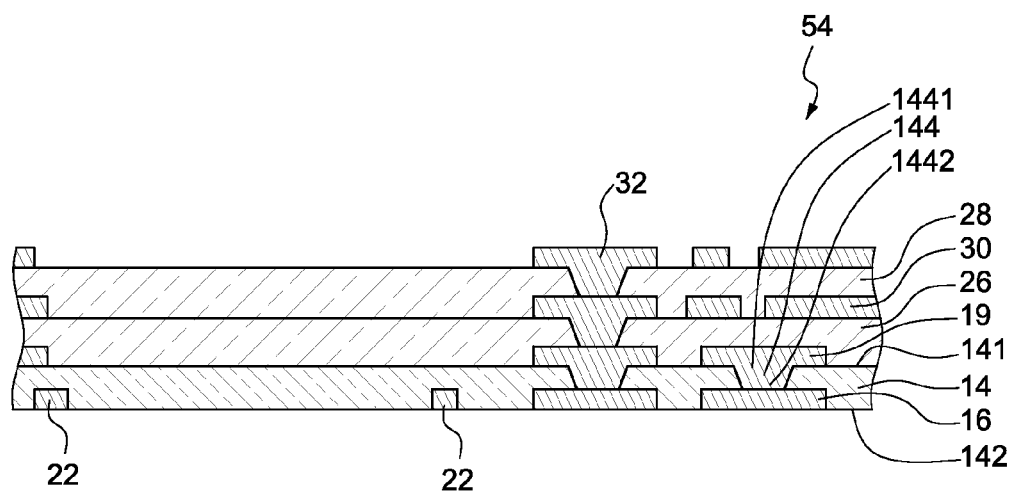

Referring to FIG. 8C, a second sub-substrate 54 is provided. The second sub-substrate 54 of this embodiment is same as the second sub-substrate 54 of FIG. 6C.

Figure 8D:
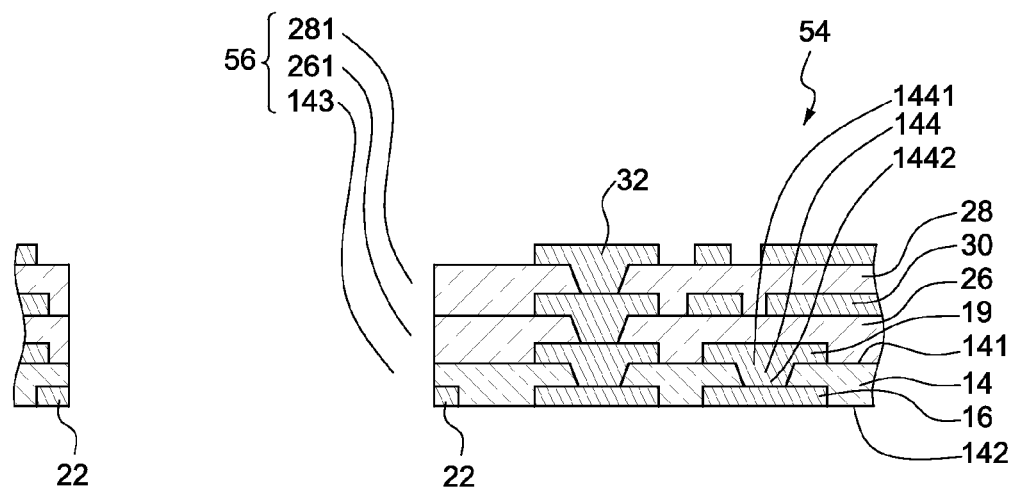

Referring to FIG. 8D, a portion of the second sub-substrate 54 is removed by, for example, a drill head or a laser beam, so as to form a through hole 56 extending through the second sub-substrate 54.

Figure 8E:
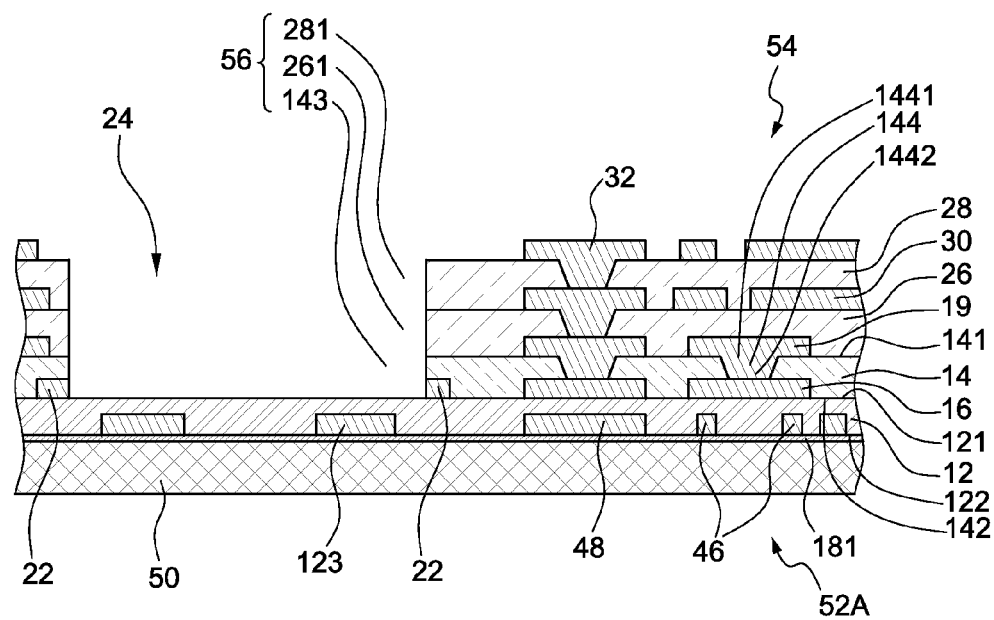

Referring to FIG. 8E, the first sub-substrate 52A is bonded to the second sub-substrate 54, so that a cavity 24 is defined by the through hole 56 and the first sub-substrate 52A.

Figure 8F:
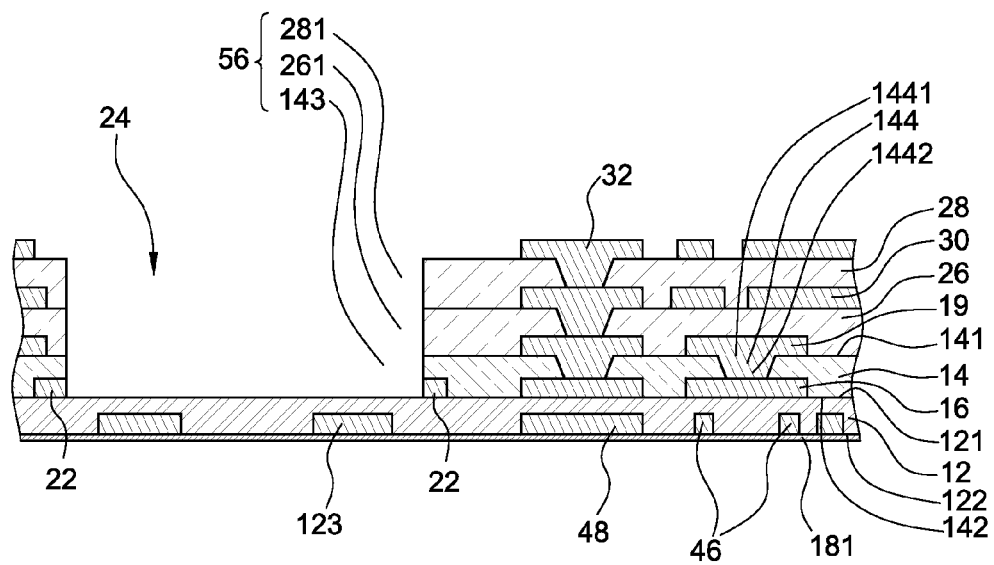

Referring to FIG. 8F, the carrier 50 is removed.

Figure 8G:
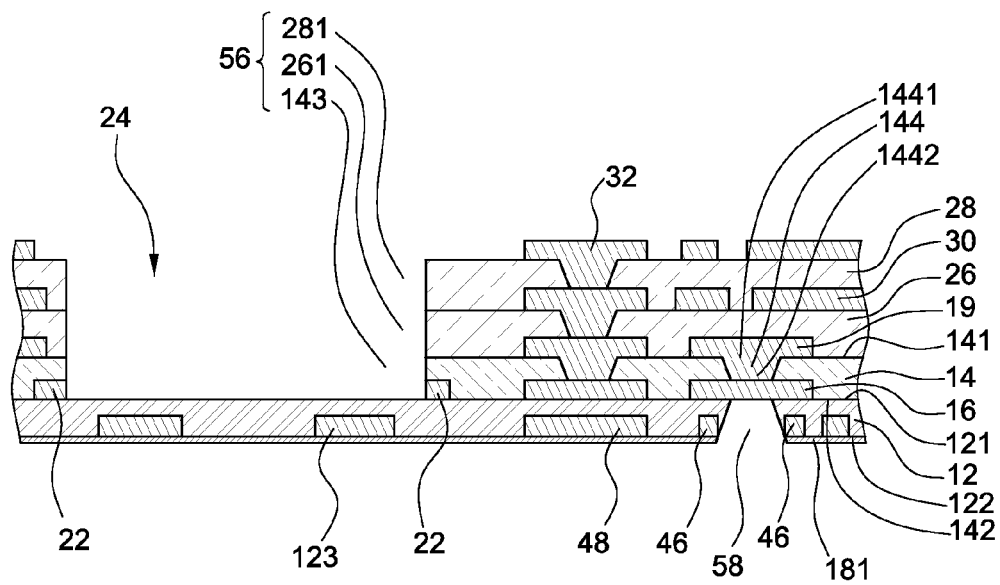

Referring to FIG. 8G, at least one opening 58 is formed in the first dielectric structure 12 and the first metal layer 181 according to the second positioning structure 46, to expose a portion of the first patterned conductive layer 16.

Figure 8H:
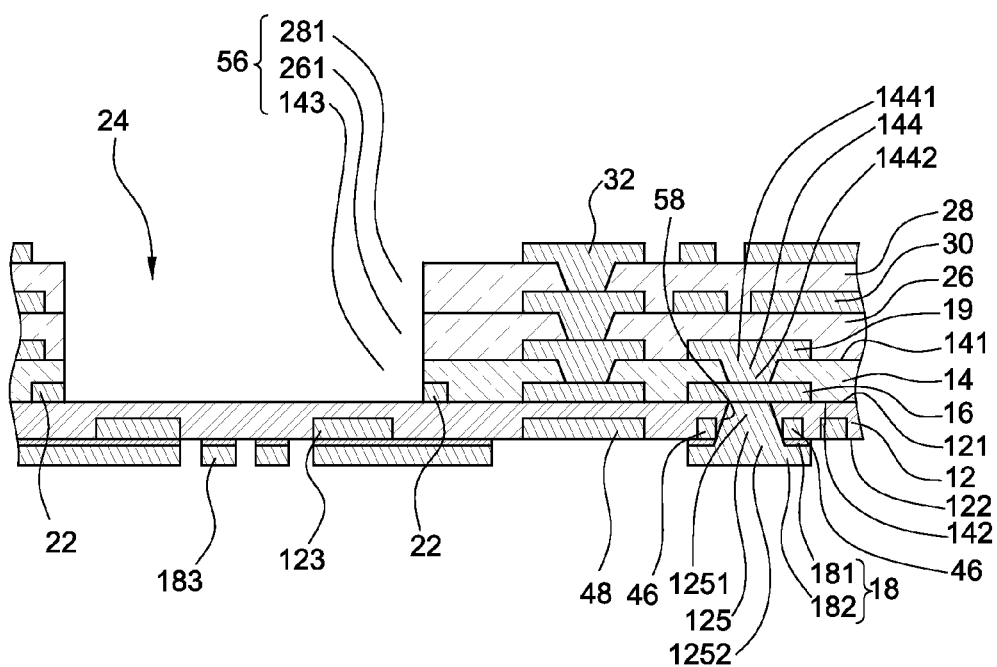

Referring to FIG. 8H, a second metal layer 182 is formed on the first metal layer 181 and in the openings 58 by, for example, electroplating. The second metal layer 182 in the openings 58 forms one or more first vias 125. The second metal layer 182 on the first metal layer 181 has a predetermined pattern, so that a portion of the first metal layer 181 is covered by the second metal layer 182 and another portion of the first metal layer 181 is not covered by the second metal layer 182. It is noted that the second metal layer 182 is not formed on the first metal layer 181 at the position corresponding to the pad 48 in this embodiment. The exposed portion of the first metal layer 181 that is not covered by the second metal layer 182 is etched away to expose the second surface 122 of the first dielectric structure 12 and the pad 48. Together, the first metal layer 181 and the second metal layer 182 form a second patterned conductive layer 18.

Figure 8I:
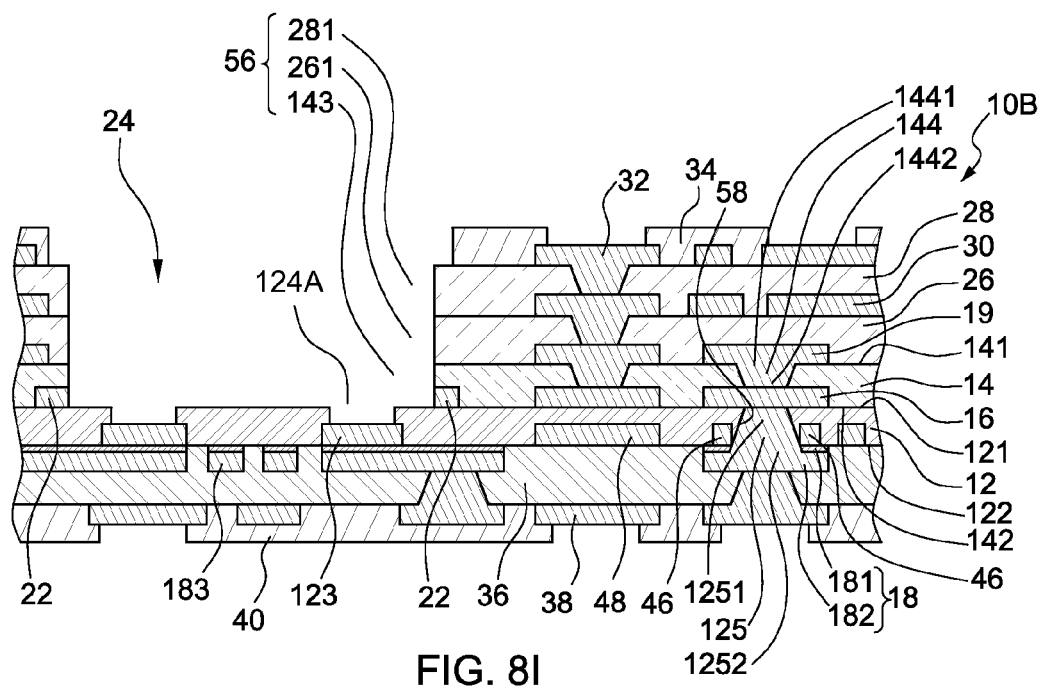

Referring to FIG. 8I, a fifth dielectric structure 36, a lowermost patterned conductive layer 38, an uppermost patterned conductive layer 32 and an upper solder mask 34 are formed in a manner similar to that described for FIG. 6I and FIG. 6J. The patterned conductive layers 38, 32 each includes a conductive material. One or more openings 124A (similar to those illustrated and described with respect to FIG. 7) are formed by removing a portion of the first dielectric layer 12 to expose the electrical contacts 123. In this manner, the semiconductor substrate 10B of FIG. 4 is obtained. An electrical component 20 is disposed in the cavity 24 of the semiconductor substrate 10B and is electrically connected to the electrical contacts 123 by SMT. In this manner, the semiconductor module 100B of FIG. 4 is obtained.

Figure 9A:
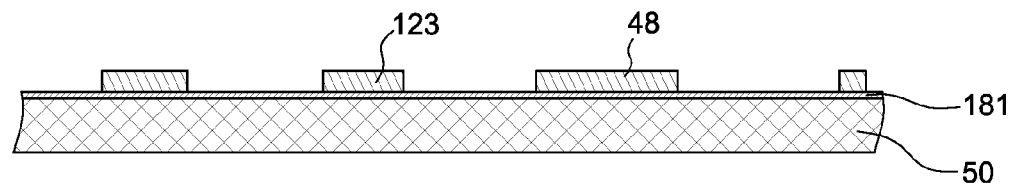
FIG. 9A, FIG. 9B, FIG. 9C, FIG. 9D, FIG. 9E, FIG. 9F, FIG. 9G, and FIG. 9H illustrate a method for manufacturing a semiconductor module according to an embodiment of the present disclosure.

FIGS. 9A-9H illustrate a method for manufacturing a semiconductor module according to another embodiment of the present disclosure. Referring to FIG. 9A, a carrier 50 and a first metal layer 181 are provided. The first metal layer 181 is, for example, a copper foil with a thickness of approximately 3 µm, and is disposed on the carrier 50. One or more electrical contacts 123 and one or more pads 48 are formed on the first metal layer 181. In this embodiment, the electrical contact 123 and the pad 48 are portions of a same layer and are formed by plating in the same process. For example, the electrical contact 123 and the pad 48 are formed by copper plating. The addition of the pad 48 can increase a plating area, which can improve evenness of plating. In this embodiment, the pad 48 is a functional pad which may be a part of a conductive patterned layer.

Figure 9B:
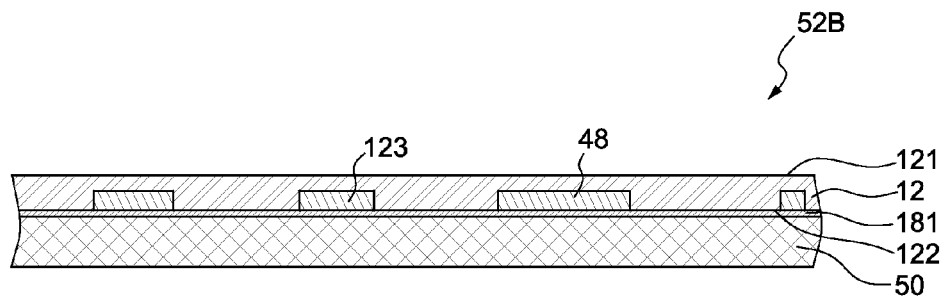

Referring to FIG. 9B, a first dielectric structure 12 is formed on the first metal layer 181 to cover the electrical contact 123 and the pad 48 to form a first sub-substrate 52B. The first sub-substrate 52B includes the carrier 50, the first metal layer 181, the first dielectric structure 12 and the pad 48. The first dielectric structure 12 of this embodiment is same as the first dielectric structure 12 of FIG. 6B.

Figure 9C:
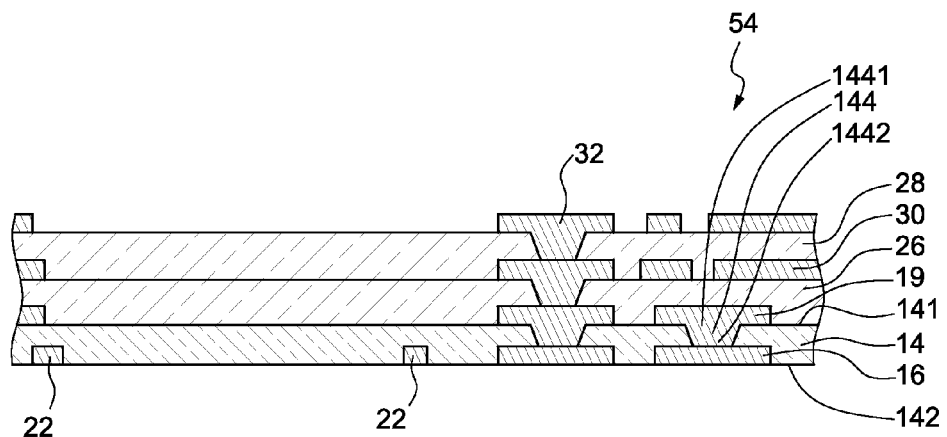

Referring to FIG. 9C, a second sub-substrate 54 is provided. The second sub-substrate 54 of this embodiment is same as the second sub-substrate 54 of FIG. 6C.

Figure 9D:
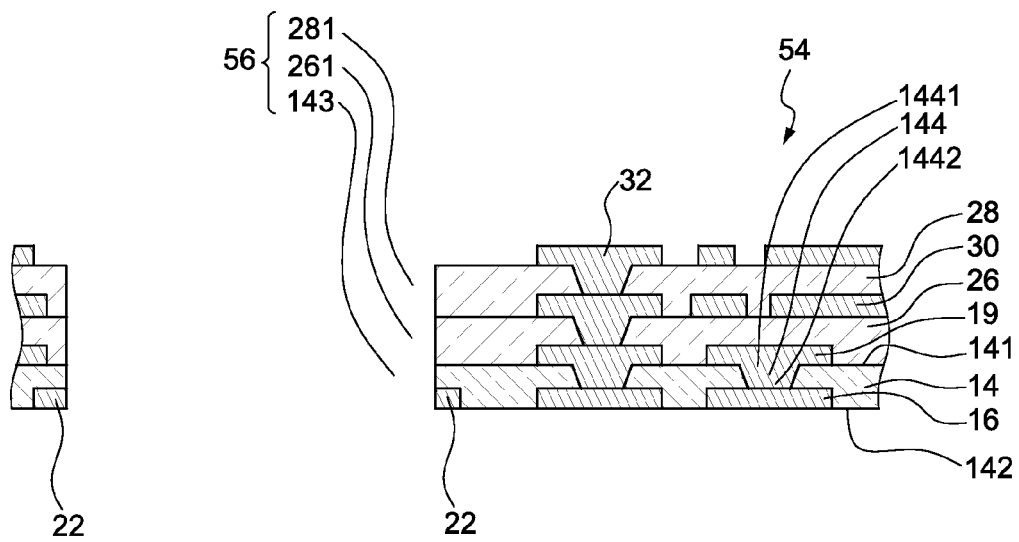

Referring to FIG. 9D, a portion of the second sub-substrate 54 is removed by, for example, a drill head or a laser beam, so as to form a through hole 56 extending through the second sub-substrate 54.

Figure 9E:
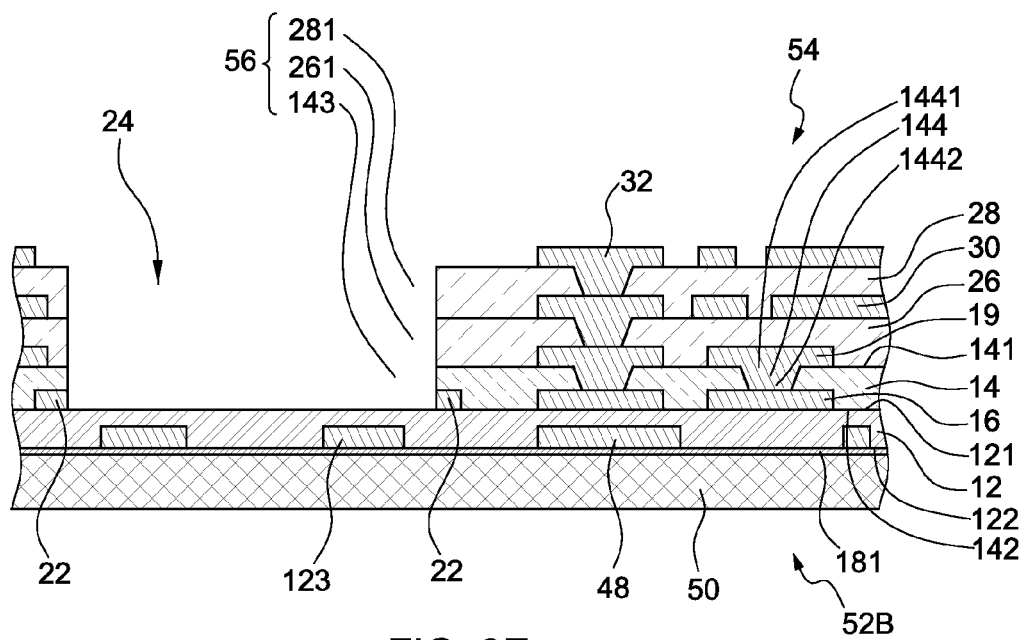

Referring to FIG. 9E, the first sub-substrate 52B is bonded to the second sub-substrate 54, so that a cavity 24 is defined by the through hole 56 and the first sub-substrate 52B.

Figure 9F:
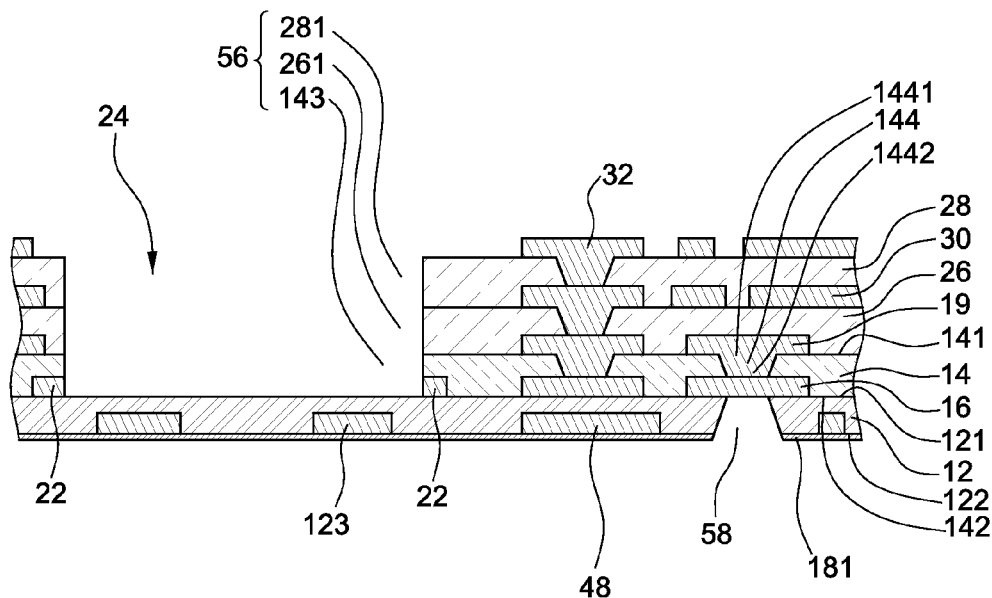

Referring to FIG. 9F, the carrier 50 is removed. One or more openings 58 are formed in the first dielectric structure 12 and the first metal layer 181 to expose a portion of the first patterned conductive layer 16.

Figure 9G:
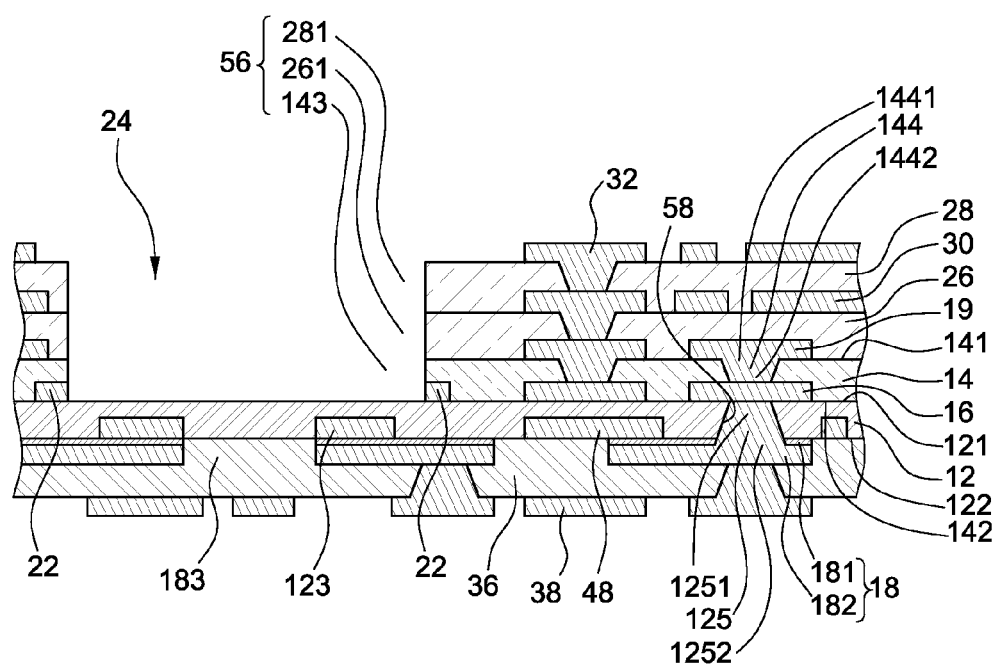

Referring to FIG. 9G, a second metal layer 182 is formed on the first metal layer 181 and in the openings 58 by, for example, electroplating. The second metal layer 182 in the openings 58 forms one or more first vias 125. The second metal layer 182 on the first metal layer 181 has a predetermined pattern, so that a portion of the first metal layer 181 is covered by the second metal layer 182 and another portion of the first metal layer 181 is not covered by the second metal layer 182. It is noted that the second metal layer 182 is formed on the first metal layer 181 at the position corresponding to a portion of the pad 48. The exposed portion of the first metal layer 181 that is not covered by the second metal layer 182 is etched away to expose the second surface 122 of the first dielectric structure 12 and a portion of the pad 48. Together, the first metal layer 181 and the second metal layer 182 form a second patterned conductive layer 18. The second patterned conductive layer 18 contacts the pad 48.

Figure 9H:
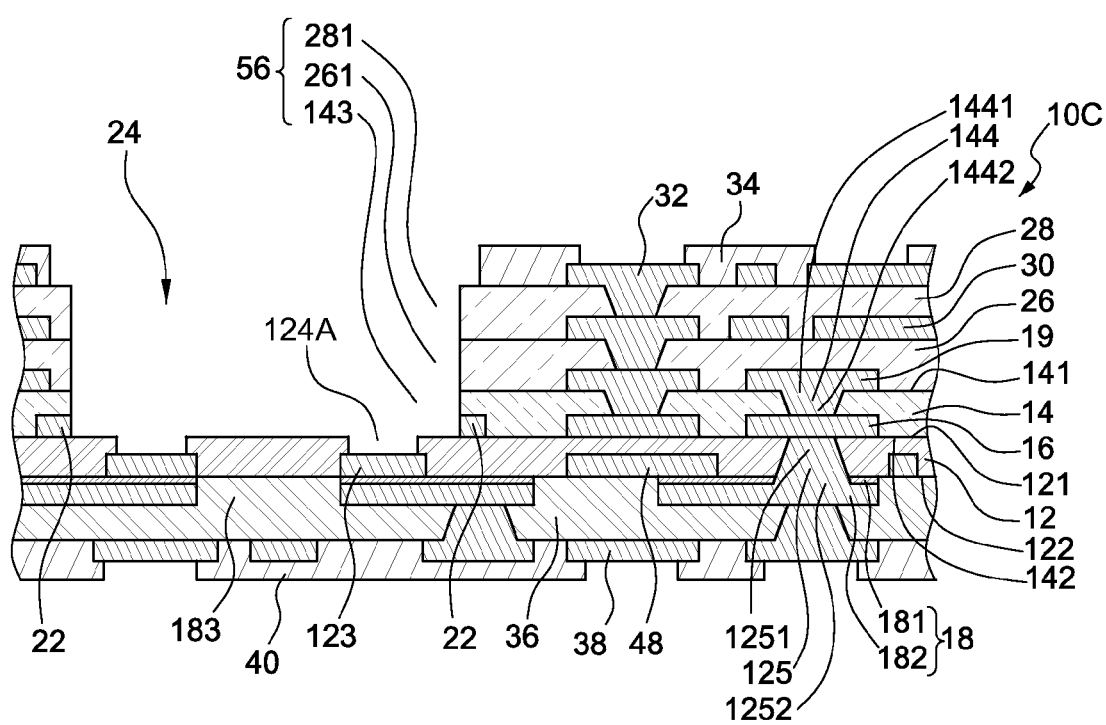

Referring to FIG. 9H, a fifth dielectric structure 36, a lowermost patterned conductive layer 38, an uppermost patterned conductive layer 32 and an upper solder mask 34 are formed. The conductive layers 38, 32 each includes a conductive material. One or more openings 124A (similar to those illustrated and described with respect to FIG. 7) are formed. In this manner, the semiconductor substrate 10C of FIG. 5 is obtained. An electrical component 20 is disposed in the cavity 24 of the semiconductor substrate 10C and is electrically connected to the electrical contacts 123 by SMT. In this manner, the semiconductor module 100C of FIG. 5 is obtained.

As used herein and not otherwise defined, the terms "approximately," "substantially" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Two surfaces can be deemed to be coplanar or substantially coplanar if a displacement between the two surfaces is, for example, no greater than 5 µm, no greater than 2 µm, no greater than 1 µm, no greater than 0.5 µm, or no greater than 0.2 µm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure. The illustrations may not necessarily be drawn to scale. There may be distinctions between the artistic renditions in the present disclosure and the actual apparatus due to manufacturing processes and tolerances.

There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor substrate, comprising:
   a first dielectric structure having a first surface and a second surface opposite the first surface;
   a second dielectric structure having a third surface and a fourth surface opposite the third surface, wherein the fourth surface is adjacent to the first surface of the first dielectric structure, the second dielectric structure defining a through hole extending from the third surface to the fourth surface, wherein a cavity is defined by the through hole and the first dielectric structure;
   a first patterned conductive layer, disposed on the first surface of the first dielectric structure;
   a second patterned conductive layer, disposed on the second surface of the first dielectric structure; and
   a plurality of electrical contacts embedded in the first dielectric structure, wherein the electrical contacts are electrically connected to and in physical contact with the second patterned conductive layer, and the second patterned conductive layer includes at least one conductive trace positioned between the electrical contacts.

2. The semiconductor substrate of claim 1, wherein the first patterned conductive layer is embedded in the second dielectric structure.

3. The semiconductor substrate of claim 1, wherein at least one of the plurality of electrical contacts is exposed from the first dielectric structure within the cavity.

4. The semiconductor substrate of claim 3, wherein the first dielectric structure defines at least one opening on the first surface to expose the electrical contact within the cavity.

5. The semiconductor substrate of claim 4, wherein the at least one electrical contact is the plurality of electrical contacts and the at least one opening is a plurality of openings, wherein each of the openings corresponds to a respective one of the electrical contacts.

6. The semiconductor substrate of claim 4, wherein the at least one electrical contact is the plurality of electrical contacts and the at least one opening is one opening, and a periphery of the one opening corresponds to a periphery of the cavity such that a surface of the first dielectric structure at a bottom of the opening is a bottom surface of the cavity.

7. The semiconductor substrate of claim 1, wherein the second dielectric structure is a build-up layer.

8. The semiconductor substrate of claim 1, further comprising:
   at least one first via embedded in the first dielectric structure and connecting the first patterned conductive layer and the second patterned conductive layer, wherein the first via includes an upper portion and a lower portion, and a width of the upper portion of the first via is less than a width of the lower portion of the first via;
   a third patterned conductive layer on the third surface; and
   at least one second via embedded in the second dielectric structure and connecting the first patterned conductive layer and the third patterned conductive layer, wherein the second via includes an upper portion and a lower portion, and a width of the upper portion of the second via is greater than a width of the lower portion of the second via.

9. The semiconductor substrate of claim 1, wherein a material of the first dielectric structure is different from a material of the second dielectric structure.

10. The semiconductor substrate of claim 1, wherein the first dielectric structure includes an adhesive material.

11. The semiconductor substrate of claim 1, wherein the fourth surface contacts the first surface.

12. A semiconductor module, comprising:
    a semiconductor substrate, comprising:
        a first dielectric structure, having a first surface and a second surface opposite the first surface;
        a second dielectric structure, having a third surface and a fourth surface opposite the third surface, wherein the fourth surface is adjacent to the first surface of the first dielectric structure, the second dielectric structure defining a through hole extending from the third surface to the fourth surface, wherein a cavity is defined by the through hole and the first surface of the first dielectric structure;
        a first patterned conductive layer, disposed on the first surface of the first dielectric structure; and
        a second patterned conductive layer, disposed on the second surface of the first dielectric structure;
    an electrical component disposed in the cavity and electrically connected to the second patterned conductive layer; and
    a plurality of electrical contacts embedded in the first dielectric structure, wherein the electrical contacts are electrically connected to and in physical contact with the second patterned conductive layer, and the second patterned conductive layer includes at least one conductive trace positioned between the electrical contacts.

13. The semiconductor module of claim 12, wherein the electrical component is a passive component.

14. The semiconductor module of claim 12, wherein the electrical component includes at least one electrode.

15. The semiconductor module of claim 14, wherein the first dielectric structure defines at least one opening on the first surface to expose at least one of the plurality of electrical contacts within the cavity.

16. The semiconductor module of claim 15, wherein the at least one opening is a plurality of openings, and each of the openings corresponds to a respective one of the plurality of electrical contacts.

17. The semiconductor module of claim 15, wherein the at least one opening is one opening, and a periphery of the opening corresponds to a periphery of the cavity.

18. The semiconductor module of claim 12, wherein the second dielectric structure is a build-up layer.

19. The semiconductor module of claim 12, further comprising:
    at least one first via embedded in the first dielectric structure and connecting the first patterned conductive layer and the second patterned conductive layer, wherein the first via includes an upper portion and a lower portion, and a width of the upper portion of the first via is less than a width of the lower portion of the first via;

a third patterned conductive layer on the third surface; and at least one second via embedded in the second dielectric structure and connecting the first patterned conductive layer and the third patterned conductive layer, wherein the second via includes an upper portion and a lower portion, and a width of the upper portion of the second via is greater than a width of the lower portion of the second via.

20. The semiconductor module of claim 12, wherein the first dielectric structure includes an adhesive material.

* * * * *